United States Patent [19]

Oritani

[11] Patent Number: 4,885,479
[45] Date of Patent: Dec. 5, 1989

[54] BUFFER AMPLIFIER CIRCUIT

[75] Inventor: Atsushi Oritani, Kanagawa, Japan

[73] Assignee: Fujitsu Limited, Kawasaki, Japan

[21] Appl. No.: 658,055

[22] Filed: Oct. 4, 1984

Related U.S. Application Data

[63] Continuation of Ser. No. 320,764, Nov. 12, 1980, abandoned.

[30] Foreign Application Priority Data

Nov. 12, 1980 [JP] Japan ................................ 55-159170

[51] Int. Cl.$^4$ .................. H03K 17/687; H03K 17/14; H03K 19/092; H03K 3/356
[52] U.S. Cl. .................................... 307/443; 307/290; 307/464; 307/475
[58] Field of Search ............... 307/279, 290, 448, 475, 307/270, 572, 574, 575, 450, 530, 464, 443

[56] References Cited

U.S. PATENT DOCUMENTS

| | | | |
|---|---|---|---|
| 3,882,331 | 5/1975 | Sasaki | 307/279 |
| 4,071,784 | 1/1978 | Maeder et al. | 307/290 X |
| 4,097,772 | 6/1978 | Carter | 307/475 X |
| 4,242,604 | 12/1980 | Smith | 307/290 X |
| 4,274,147 | 6/1981 | Padgett et al. | 365/104 X |
| 4,375,039 | 2/1983 | Yamauchi | 307/475 X |

FOREIGN PATENT DOCUMENTS 4101226 9/1979 Japan .................................. 307/475

OTHER PUBLICATIONS

Clemen et al., "$V_t$-Compensated TTL-Compatible MOS Amplifier", IBM, Tech. Discl. Bull., vol. 21, No. 7, pp. 2874-2875, Dec. 78.

Primary Examiner—Stanley D. Miller
Assistant Examiner—David R. Bertelson
Attorney, Agent, or Firm—Staas & Halsey

[57]  ABSTRACT

A high speed buffer amplifier circuit comprising a first inverter including a driver transistor, a second inverter which receives the output signal from the first inverter, and, a control transistor which is driven by the output signal from the second inverter and which operates so as to accelerate the effect of the input signal applied between the gate and the source electrode of the driver transistor of the first inverter.

12 Claims, 4 Drawing Sheets

BUFFER AMPLIFIER CIRCUIT

This is a continuation of co-pending application Ser. No. 320,764 filed on 11/12/80, now abandoned.

BACKGROUND OF THE INVENTION (1) Field of the Invention

The present invention relates to a buffer amplifier circuit which has a high operating speed and which is used, for example, as an address buffer circuit in a semiconductor memory device.

(2) Description of the Prior Art

FIG. 1 illustrates a conventional buffer amplifier circuit which is used, for example, as an input buffer circuit such as an address buffer circuit of a semiconductor memory device. The buffer amplifier circuit of FIG. 1 has an inverter structure and comprises a series of connection of an N-channel enhancement type MIS driver transistor Q1 and an N-channel depletion type MIS load transistor Q2. In FIG. 1, A designates an input signal, B designates an output signal and Vcc designates a power supply voltage.

In the buffer amplifier circuit of FIG. 1, when the potential of the input signal A becomes high, the N-channel MIS transistor Q1 is turned on and the output signal B becomes low. On the contrary, when the potential of the input signal A becomes low, the transistor Q1 is turned off and the output signal B becomes high. However, such an operation is guaranteed only when the input signal A has an amply high potential level and an amply low potential level and is in the steady state condition.

As illustrated in FIG. 2A, an internal logic signal A' of a MIS integrated circuit generally has a high potential level (H) of 5V and a low potential level (L) of 0V and, therefore, has an amply large amplitude for driving the inverter circuit of FIG. 1. However, since the input signal to the MIS integrated circuit is transferred through printed circuit patterns and/or lead wires from another TTL circuit, the input signal is attenuated and the amplitude thereof becomes smaller. Moreover, as shown by Aa in FIG. 2A, the actual input signal has oscillations. Therefore, the effective high potential level of the input signal becomes, for example, 2V and the effective low potential level of the input signal becomes, for example, 0.8V. When such an input signal is applied to the inverter circuit of FIG. 1, the operating speed of the inverter circuit becomes slow. This is, the switching time of the output signal B between a high and a low potential level becomes long, and, in the worst case, the switching operation between the high and low potential levels is not effected correctly. The operating speed of the inverter circuit of FIG. 1 is also influenced by the gm characteristics of the transistors Q1 and Q2. For example, when the gms of the transistors Q1 and Q2 are equal to each other, the rise time from the low potential level L to the high potential level H and the fall time from the high potential level to the low potential level of the output signal B are nearly equal to each other as illustrated in FIG. 2B. However the operating speed of such an inverter circuit cannot be fast. If the gm ratio of the transistors Q1 and Q2, i.e., the ratio of the gm of the transistor Q1 to the gm of the transistor Q2 becomes smaller than 1, the rise time of the output signal B becomes short and the fall time of the output signal B becomes long as illustrated by solid lines C1 of FIG. 2A. On the contrary, if the gm ratio is larger than 1, the rise time becomes long and the fall time becomes short as illustrated by dotted lines C2 of FIG. 2A. The gm ratio also influences the threshold potential level $V_{th}$, of the input signal A of the inverter circuit of FIG. 1. As illustrated in FIG. 2C, in order to gain the high threshold potential level $V''_{th}$, it is necessary to make the gm ratio smaller; and, in order to gain the low threshold potential level $V'_{th}$, it is necessary to make the gm ratio larger. Since it is necessary to adjust the threshold potential $V_{th}$ to an appropriate level according to the potential levels of the input signal and according to the structure of the pre-stage circuit (e.g. TTL or MIS circuit) connected to the inverter circuit of FIG. 1, the gm ratio and, therefore, the operation speed of the conventional buffer amplifier are limited by the potential levels of the input signal.

If the amplitude of the input signal is amply large, the driver transistor Q1 is overdriven by the input signal and the operation speed of the inverter circuit of FIG. 1 can be fast. However, if the amplitude of the input signal is small, for example if L=0.8V, H=2.0V and $V_{th}$=1.4V, the conventional buffer amplifier of FIG. 1 cannot operate fast and reliably.

FIG. 3 illustrates a conventional address buffer circuit of a semiconductor memory device which uses the buffer amplifier circuits of FIG. 1. The address buffer circuits of FIG. 3 comprises the first, the second and the third inverter circuits INV1, INV2 and INV3 which consist of MIS transistor pairs Q3, Q4; Q5, Q6 and Q7, Q8, respectively, and each of which has the same circuit structure as that of the inverter circuit of FIG. 1. The address buffer circuit of FIG. 3 further comprises two output buffer amplifiers BA1 and BA2 which consist of MIS transistor pairs Q9, Q10 and Q11, Q12, respectively and which output buffered address signals $A_0$ and $\overline{A_0}$, respectively.

In the above-mentioned conventional address buffer circuit of FIG. 3, it is necessary to use two stage inverters INV1 and INV2 in order to obtain the address signals having short rise and fall times. This is because, the amplitude of the input address signal $A_0$ applied to the first inverter INV1 is not always amply large, and therefore, the rise and fall times of the output signal from the first inverter INV1 cannot be short. Therefore, the signal delay of the address buffer amplifier of FIG. 3 is large.

SUMMARY OF THE INVENTION

It is, therefore, the principal object of the present invention to provide a buffer amplifier circuit having a high operating speed.

It is another object of the present invention to decrease the rise and fall times of an output signal from the buffer amplifier circuit.

It is still another object of the present invention to decrease the delay time of the output signal from the buffer amplifier circuit.

It is still another object of the present invention to provide a buffer amplifier circuit having a threshold potential determined in accordance with the potential level of the input signal.

It is still another object of the present invention to provide a buffer amplifier circuit which operates reliably.

According to the present invention, there is provided a buffer amplifier circuit comprising a first inverter including a first driver transistor whose gate electrode receives an input signal; a second inverter including a second driver transistor whose gate electrode receive the output signal from the first inverter and whose source electrode is commonly connected to the source electrode of the first driver transistor; and a control transistor whose drain electrode is connected to the commonly connected source electrodes of the first and second driver transistors and which changes the potential of the commonly connected source electrodes so as to enlarge the change of the potential of the input signal applied between the gate and source electrodes of the first driver transistor.

DESCRIPTION OF THE PREFERRED EMBODIMENT

Figure 4:
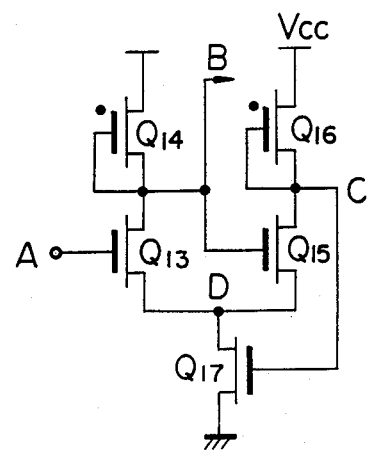
FIG. 4 is a circuit diagram illustrating a buffer amplifier circuit as an embodiment of the present invention.

FIG. 4 illustrates an inverter type buffer amplifier circuit embodiment of the present invention. The buffer amplifier circuit of FIG. 4 comprises a first inverter including a driver transistor Q13 and a load transistor Q14, a second inverter including a driver transistor Q15 and a load transistor Q16, and, a control transistor Q17. The source electrodes of the driver transistors Q13 and Q15 are commonly connected to the drain electrode of the control transistor Q17. Both of the load transistors Q14 and Q16 are depletion type MIS transistors and the other transistors Q13, Q15 and Q17 are all enhancement type MIS transistors. The output terminal of the first inverter, i.e., the drain electrode of the transistor Q13 is connected to the input terminal of the second inverter, i.e., the gate electrode of the transistor Q15. The output terminal of the second inverter, i.e., the drain electrode of the transistor Q15 is connected to the gate electrode of the control transistor Q17.

Figure 5:
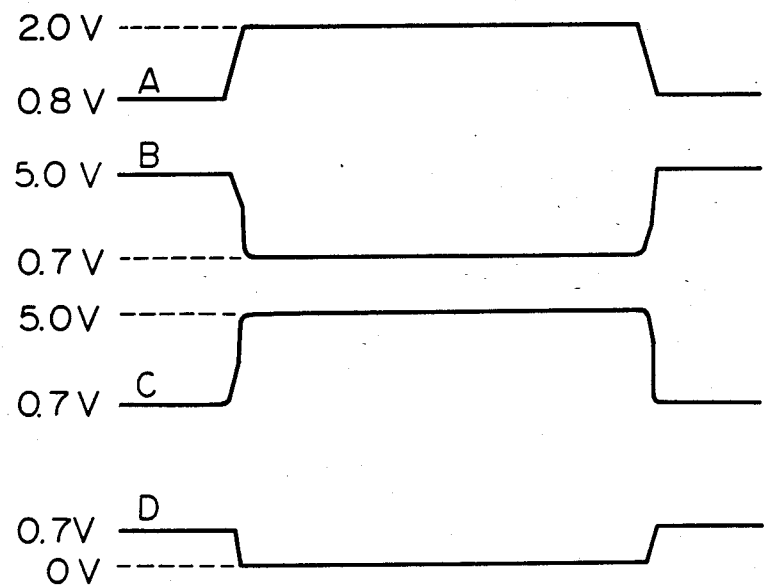
FIG. 5 is a waveform diagram illustrating the signals in the buffer amplifier circuit of FIG. 5.

With reference to FIG. 5, the operation of the buffer amplifier circuit of FIG. 4 will now be described. Assume that the input signal A has changed from a low level, e.g. 0.8V, to a high level, e.g. 2.0V. In this condition, the transistor Q13 is turned on, and the output signal B changes from a high level, e.g. 5 V to a low level, e.g. 0.7V. In response to transistor Q13 turning on, the transistor Q15 is turned off, and the output signal C of the second inverter becomes high, e.g. 5 V. Therefore, the control transistor Q17 is turned on, and the potential D of the drain electrode of the control transistor Q17 to which the source electrodes of the driver transistors Q13 and Q15 are connected becomes low, e.g. 0 V. Therefore, the input potential applied between the gate and source electrodes of the driver transistor Q13 is enlarged and the turning-on of the driver transistor Q13 is accelerated.

On the contrary, when the input signal A changes from a high level to a low level, the driver transistor Q13 is turned off and the output signal B changes from low to high. In response to the change of the output signal B from low to high, the driver transistor Q15 is turned on, and the output signal C from the second inverter becomes low, so that the control transistor Q17 is driven into an off condition, and the potential D becomes high, e.g. 0.7 V. Therefore, the input potential applied between the gate and source electrodes of the control transistor Q17 is decreased and the turning-off of the driver transistor Q13 is accelerated. As a result, in the buffer amplifier circuit of FIG. 4, both the rise time and the fall time can be very short even when the amplitude of the input signal A is not large. Moreover, the threshold potential of the input signal A can be determined by the gm ratio of the transistors Q13 and Q14 to any appropriate value according to the potential levels of the input signal A without affecting the operating speed of the buffer amplifier circuit.

Figure 6:
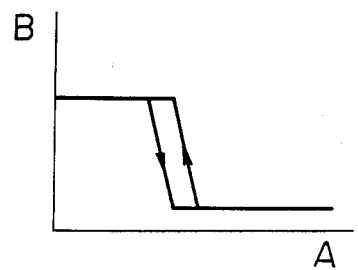
FIG. 6 is a graph illustrating an input-output characteristic of the buffer amplifier circuit of FIG. 5.

FIG. 6 illustrates an input-output characteristic of the buffer amplifier circuit of FIG. 4. Since the potential D of the drain electrode of the control transistor Q17 changes in an direction opposite to that of the input signal A, the relation between the input signal A and the output signal B follows a hysteresis characteristic.

Figure 1:
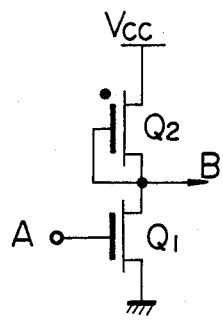
FIG. 1 is a circuit diagram illustrating a conventional inverter type buffer amplifier.
Figure 2A:
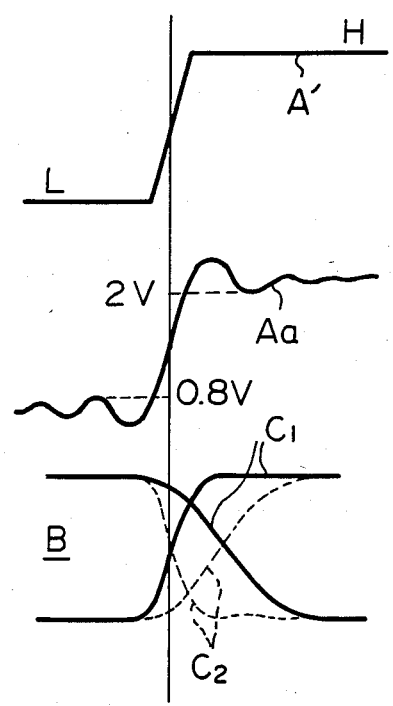
FIGS. 2A and 2B and waveform diagrams illustrating the signals in the buffer amplifier of FIG. 1.
Figure 2B:
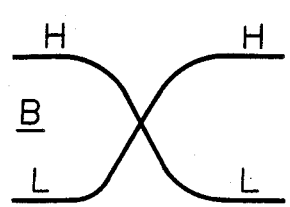
Figure 2C:
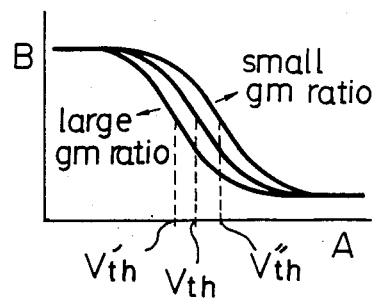
FIG. 2C is a graph illustrating input-output characteristics of the buffer amplifier of FIG. 1.
Figure 3:
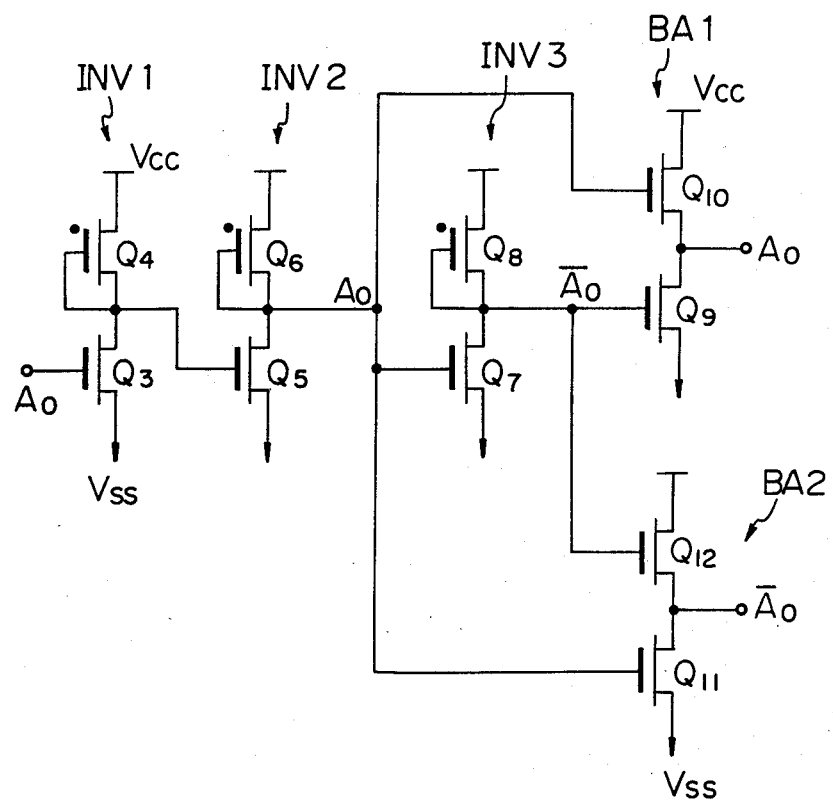
FIG. 3 is a circuit diagram illustrating a conventional address buffer circuit.
Figure 7:
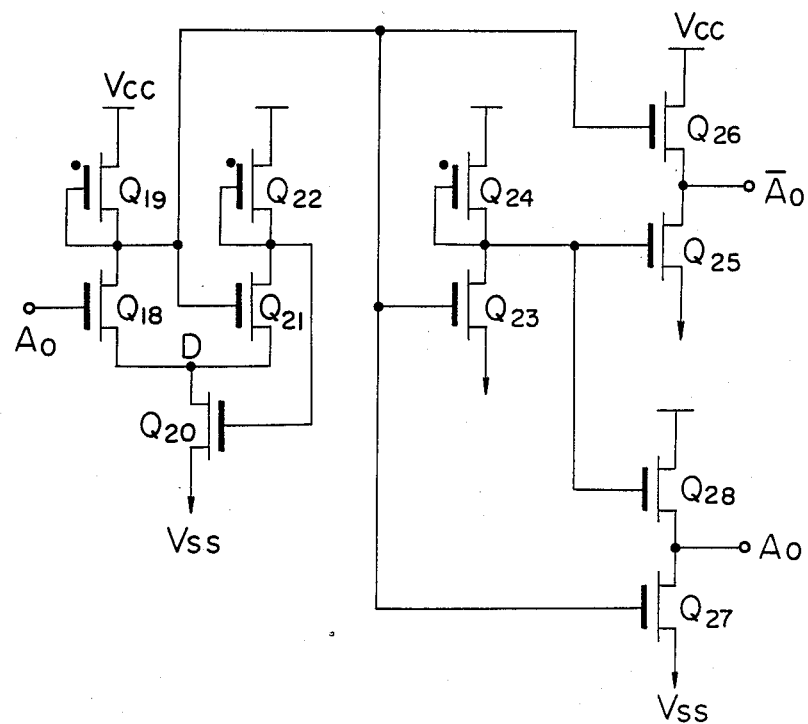
FIG. 7 is a circuit diagram illustrating an address buffer circuit according to the present invention.

FIG. 7 illustrates an address buffer circuit which is used in a semiconductor memory device and which includes a buffer amplifier circuit according to the present invention. The address buffer circuit of FIG. 7 comprises an input buffer amplifier stage which includes MIS transistor Q18 through Q22, which has the same circuit structure as that of the buffer amplifier circuit of FIG. 4; and includes an output buffer stage which includes MIS transistors Q23 through Q28, which has the same circuit structure as that of the output buffer stage of the circuit of FIG. 3 including the inverter INV3 and the buffer amplifiers BA1 and BA2. The operation of the address buffer circuit is apparent from the above description, and therefore the explanation thereof is omitted here. In the address buffer circuit of FIG. 7, the signal delay time of the output address signals $A_O$ and $\overline{A_O}$ can be very small and the threshold potential of the input address signal $A_0$ can be selected to an appropriate value according to the potential levels of the input address signal $A_0$.

As mentioned above, according to the present invention, it is possible to increase the operation speed of the inverter type buffer amplifier circuit, by using simple circuitry including the control MIS transistor which enlarges the change of the input potential applied between the gate and the source electrodes of the driver transistor.

I claim:

1. A buffer amplifier circuit comprising a first inverter having a buffer input terminal and buffer output terminal and including
   a first driver transistor having a drain operatively connected to said output terminal of said buffer amplifier, a source, and a gate electrode connected to said buffer input terminal to receive an input signal, and
   a first load connected to the drain of said first driver transistor and to receive a power supply voltage; a second inverter having an output and including
   a second driver transistor having a drain corresponding to said output of said second inverter, a gate electrode connected to receive the output signal from said first inverter and having a source electrode connected to the source electrode of said first driver transistor, and a second load connected to the drain of said second driver transistor and to receive said power supply voltage;

a control transistor having a drain electrode connected to the source electrodes of said first and second driver transistors and having a gate connected to said output of said second inverter and having a source operatively connected to receive a second voltage being less than said power supply voltage, the potential of the gate of said control transistor being controlled by said second inverter so that the potential of said connected source electrodes is varied so as to change the potential between the gate and source electrodes of said first driver transistor in such a way that, when said first driver transistor is being turned from OFF to ON, said control transistor is completely turned ON, and when said first driver transistor is being turned from ON to OFF, said control transistor is completely turned OFF.

2. A buffer amplifier circuit of claim 1 wherein said buffer amplifier circuit is used as an address buffer circuit of a semiconductor memory device which receives an address input signal to the gate electrode of said first driver transistor.

3. A buffer amplifier circuit of claim 1 wherein said buffer amplifier circuit receives an input signal having TTL logic levels.

4. A buffer amplifier circuit of claim 1, wherein said first load comprises a transistor.

5. A buffer amplifier circuit of claim 4, wherein said first driver transistor is an enhancement type MIS transistor and said load transistor of said first inverter is a depletion type MIS transistor.

6. A buffer amplifier circuit of claim 1, wherein said second load comprises a transistor.

7. A buffer amplifier circuit of claim 6, wherein said second driver transistor is an enhancement type MIS transistor and said second load transistor is a depletion type MIS transistor.

8. An improved buffer amplifier comprising:
first inverter means for receiving an input signal and providing an output therefrom;
second inverter means for receiving said output signal from said first inverter means and providing a further output signal; and
additional means for accelerating the effect of said input signal and said output on said first and second inverter means, respectively, said acceleration being in accordance with said further output of said second inverter means.

9. An improved buffer amplifier as set forth in claim 8, wherein said additional means functions so that there is a hysteresis characteristic relationship between the input signal and the output signal.

10. An improved buffer amplifier as set forth in claim 9, wherein said first and second inverter means each includes a drive transistor and a load transistor.

11. An improved buffer amplifier as set forth in claim 9, wherein said additional means includes a control transistor connected to receive the further output.

12. An improved buffer amplifier as set forth in claim 8, wherein said additional means includes a control transistor connected to receive the further output.

* * * * *